(12) United States Patent
Lewis

(10) Patent No.: US 7,772,872 B2
(45) Date of Patent: Aug. 10, 2010

(54) MULTI-ROW BLOCK SUPPORTING ROW LEVEL REDUNDANCY IN A PLD

(75) Inventor: David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 9 days.

(21) Appl. No.: 12/206,616

(22) Filed: Sep. 8, 2008

(65) Prior Publication Data

US 2010/0060309 A1   Mar. 11, 2010

(51) Int. Cl.
H03K 19/003 (2006.01)
H03K 19/177 (2006.01)

(52) U.S. Cl. .................................. 326/10; 326/41
(58) Field of Classification Search ................ 326/10, 326/37, 38, 41, 47
See application file for complete search history.

(56) References Cited

U.S. PATENT DOCUMENTS

| | | | |
|---|---|---|---|
| 6,201,404 B1 | 3/2001 | Reddy et al. ................. 326/10 |
| 6,344,755 B1 | 2/2002 | Reddy et al. | |
| 6,965,249 B2 | 11/2005 | Lane et al. ................. 326/10 |
| 7,180,324 B2 | 2/2007 | Chan et al. ................. 326/10 |
| 7,215,140 B1 * | 5/2007 | Saini et al. ................. 326/41 |

* cited by examiner

*Primary Examiner*—Daniel D Chang
(74) *Attorney, Agent, or Firm*—Weaver Austin Villeneuve & Sampson LLP

(57) ABSTRACT

In a Programmable Logic Device (PLD), a multi-row block that has internal logic connections between rows has redundant internal connections between rows to replace the internal logic connections when a fault occurs. The redundant internal logic connections extend through a row, linking the row above a defective row with a row below the defective row. Elements in a multi-row block are configurable to perform a default function and a function of an element in a neighboring row, if the functions are different.

19 Claims, 7 Drawing Sheets

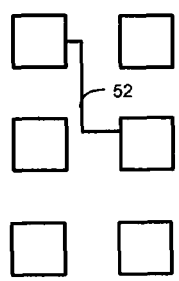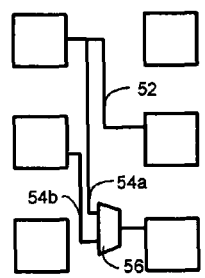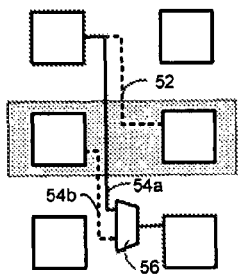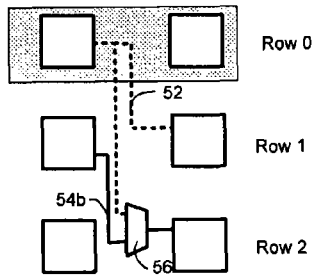
*FIG. 4A*  *FIG. 4B*  *FIG. 4C*  *FIG. 4D*
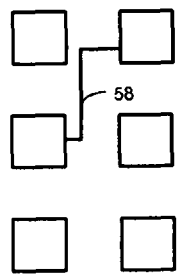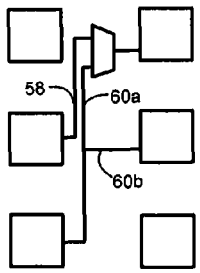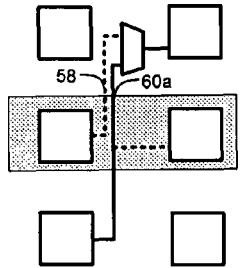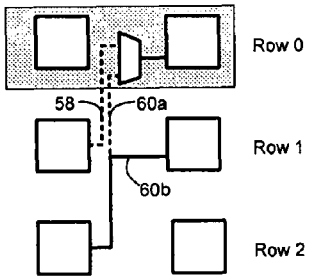
*FIG. 5A*  *FIG. 5B*  *FIG. 5C*  *FIG. 5D*
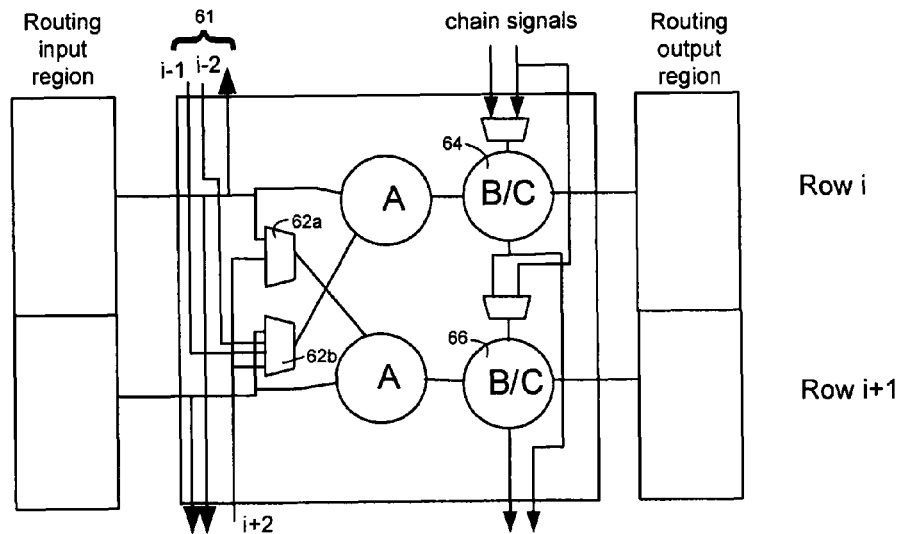
*FIG. 6*

MULTI-ROW BLOCK SUPPORTING ROW LEVEL REDUNDANCY IN A PLD

BACKGROUND OF THE INVENTION

1. Field of the Invention

The present invention relates to programmable logic devices having redundant circuitry.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical lines that may or may not extend the length of the PLD.

PLDs have configuration elements that may be programmed or reprogrammed. Configuration elements may be realized as RAM bits, flip-flops, EEPROM cells, or other memory elements. Placing new data into the configuration elements programs or reprograms the PLD's logic functions and associated routing pathways. Configuration elements that are field programmable are often implemented as RAM cells (sometimes referred to as "CRAM" or "configuration RAM"). However, many types of configurable elements may be used including static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by or routing between other PLD elements.

PLDs having redundant circuitry can help improve production yields by providing regions on the device that can be repaired by engaging the redundant circuitry. A row based redundancy scheme typically provides at least one redundant or "spare" row in an array of logic circuitry (e.g. an array of LABs and associated routing). Row based redundancy schemes are described, for example, in commonly assigned U.S. Pat. No. 6,201,404 (entitled "Programmable Logic Device with Redundant Circuitry") and U.S. Pat. No. 6,344,755 (entitled "Programmable Logic Device with Redundant Circuitry") and are further described in commonly assigned U.S. Pat. No. 6,965,249 (entitled "Programmable Logic Device with Redundant Circuitry") and U.S. Pat. No. 7,180,324 (entitled "Redundancy Structures and Methods in a Programmable Logic Device). Typically, a repairable region may be defined above the spare row such that, if one of the rows of the logic array is defective, the spare row is activated and each row from the spare row to the bad row replaces the next higher row, thus repairing the defective region.

SUMMARY OF THE INVENTION

According to an example of a multi-row block, logic connections between rows within the multi-row block have redundant logic connections that allow replacement of all elements of a row within the block by elements of another row, including replacement of all the logic connections of the row slice. This allows row redundancy within a multi-row block, even where internal logic connections extend between rows in the block. Furthermore, where elements of a row are different to the row that it is to replace, configurable elements are used that can perform their intended (default) function and also perform the function of a corresponding element in a row above. In this way, an entire row may be replaced even where it extends through a multi-row block.

In one example, a programmable logic device includes a plurality of rows of elements interconnected by configurable connections; a plurality of row-redundancy circuits that replace defective rows with non-defective rows; a multi-row block of elements that includes elements in each of a first row, a second row, and a third row, an internal logic connection between a first element of the first row and a second element of the second row; and internal redundant connections in the multi-row block, the internal redundant connections including an internal redundant logic connection between the first element and a third element in a third row to replace the internal logic connection between the first element and the second element when the second element is defective.

In another example, a method of operating a multi-row programmable logic device containing a multi-row block, includes determining that a row of the programmable logic device is defective; rerouting input signals to and output signals from the defective row to an adjacent row; in the multi-row block that extends across the defective row and the adjacent row, replacing internal logic connections between the defective row and neighboring rows with internal logic connections between the adjacent row and the neighboring rows; and reconfiguring the elements of the adjacent row to perform functions of the defective row.

In another example, A programmable logic device includes a plurality of rows of elements; a plurality of row-redundancy circuits to replace a defective row with a non-defective row; a multi-row digital signal processing block that extends through the plurality of rows, the multi-row digital signal processing block performing different functions, using physically different elements, in different rows in the multi-row block; and a plurality of internal logic connections between rows within the multi-row block, the multi-row block having a plurality of redundant internal logic connections to replace the plurality of internal logic connections when a row of the plurality of rows is replaced by the row-redundancy circuits.

BRIEF DESCRIPTION OF THE DRAWINGS

The invention may best be understood by reference to the following description taken in conjunction with the accompanying drawings, which illustrate specific embodiments of the present invention.

FIG. 4A shows an internal logic connection from an element of row 0 to an element of row 1.

FIG. 4B shows redundant internal logic connections to replace the internal logic connection of FIG. 4A.

FIG. 4C shows the redundant logic connection used when row 1 is defective.

FIG. 4D shows the redundant logic connection used when row 0 is defective.

FIG. 5A shows an internal logic connection from an element of row 1 to an element of row 0.

FIG. 5B shows redundant internal logic connections to replace the internal logic connection of FIG. 5A.

FIG. 5C shows the redundant logic connection used when row 1 is defective.

FIG. 5D shows the redundant logic connection used when row 0 is defective.

FIG. 6 shows a two row high multi-row block having redundant internal logic connections between rows, and a configurable element in one row to replace an element of the row above.

DETAILED DESCRIPTION OF ILLUSTRATED EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
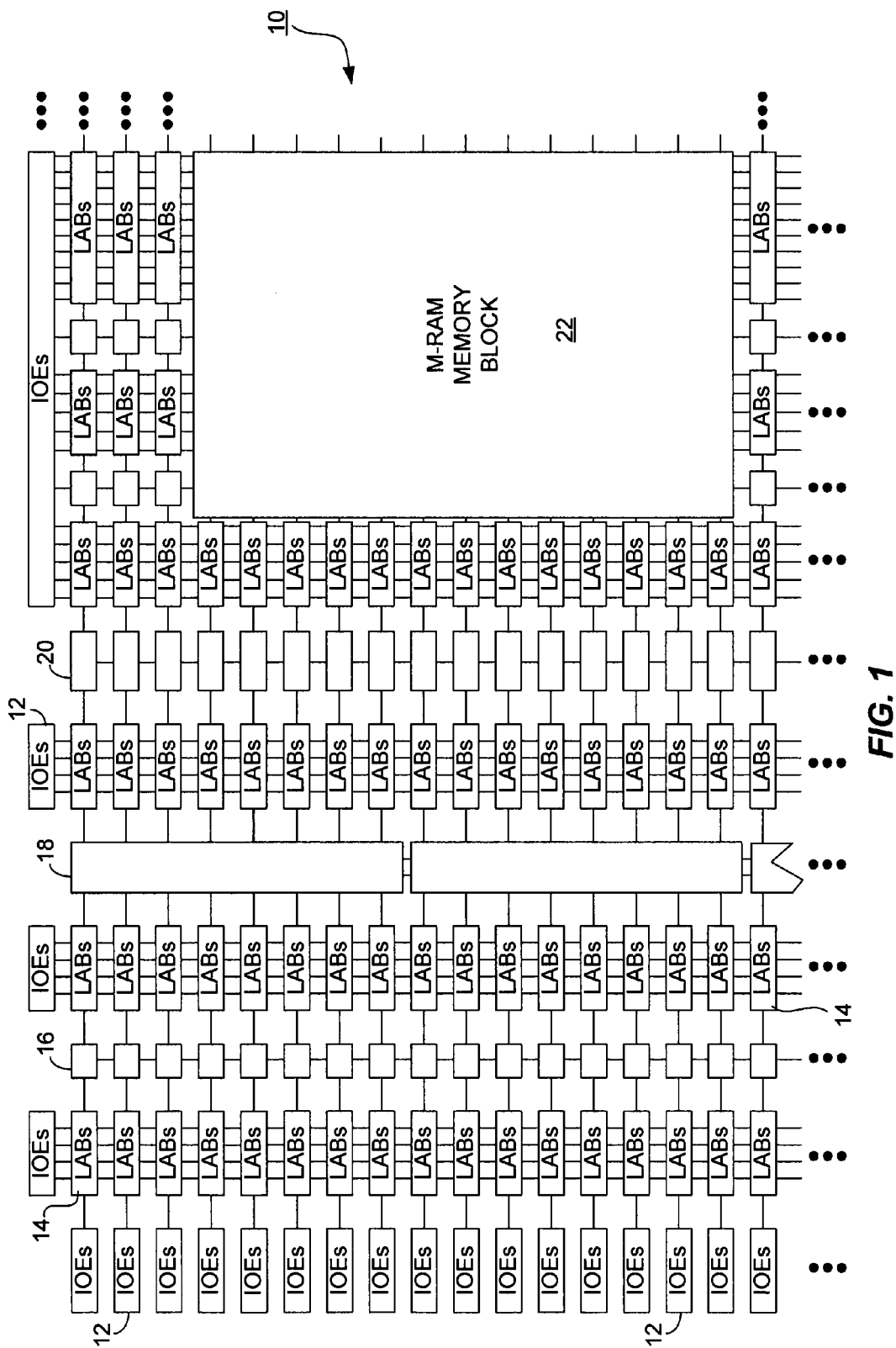
FIG. 1 shows an overview of a PLD including multi-row DSP blocks.

FIG. 1 shows an example of a block diagram of a Programmable Logic Device (PLD). The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22, each provided at different locations across the device.

The LABs 14 include a predetermined number of logic modules (not visible in the figure). In various embodiments, the number of logic modules may vary from two to sixteen or more. The RAM blocks 16 are simple dual port memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits. Both DSP blocks 18 and M-RAM memory block 22 extend through multiple rows of LABs and may be considered to be multi-row blocks. It should be noted that the PLD 10 is merely exemplary and in no way should be construed as limiting the invention. It should also be noted that the practice of the present invention, as described herein, does not require a PLD with all the above-mentioned functional blocks, listed above. Functional blocks such as the RAM blocks 16, DSP blocks 18, RAM blocks 20 and M-RAM blocks 22 are optional and are not required for the practice of the present invention.

Figure 2:
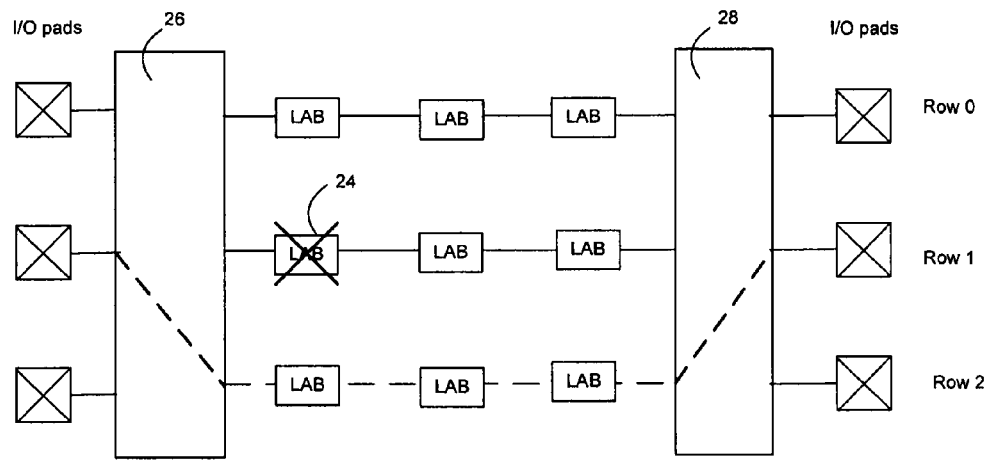
FIG. 2 shows an example of a defective row of LABs being replaced by input and output redundancy circuits.

FIG. 2 shows an example of row level redundancy in a PLD that has rows of LABs, but does not have any multi-row blocks. When a row in the PLD is defective, for example because LAB 24 in row 1 is defective as shown, defective row 1 is replaced, allowing the PLD to function normally in spite of the defective row. In particular, in FIG. 2, defective row 1 is replaced by row 2, its immediate neighbor. Input and output row redundancy circuits 26, 28 can reroute communication from one row to the next row down so that signals sent or received by I/O pads corresponding to row 1 are sent to row 2. In an array that contains a defective row, the input and output row redundancy circuits reroute all communication to and from rows below the defective row so that row functions are pushed down by one row. One or more redundant rows are provided in such an array so that all input and output communication is sent to a working row. One advantage of such redundancy circuits is increased yield. A defect in a row that would otherwise cause the PLD to be considered defective can be bypassed and the PLD can operate as normal. Any increased area needed for redundancy circuits may be offset by the increased yield that such redundant rows provide.

Figure 3A:
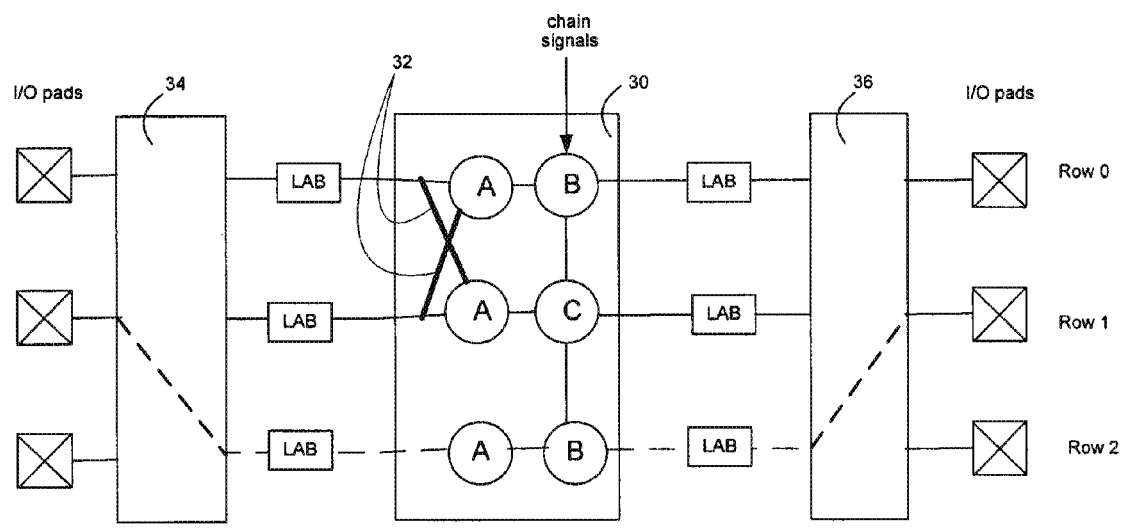
FIG. 3A shows an example of a multi-row block where conventional row replacement does not reproduce internal logic connections of the multi-row block, and individual rows have different elements.

While the scheme shown in FIG. 2 may work well for rows containing only LAB blocks, multi-row blocks are more problematic. In particular, multi-row blocks such as DSP blocks may have internal logical connections between rows to allow complex functions to be performed over more than one row. FIG. 3A shows an example of an array containing a multi-row DSP block 30. Internal interconnections 32 extend between elements of row 0 and row 1. Internal interconnections 32 are used to allow complex calculations to be performed over two or more rows, and generally support rapid communication of relatively large amounts of data. For example, multi-row blocks often perform operations on large multi-bit operands and it is important to communicate such large multi-bit numbers from one row to another when operations are distributed over multiple rows. Therefore, such internal interconnections are generally formed as multi-bit data busses (e.g. 18-bit-wide bus). If input and output row redundancy circuits 34, 36 performed row replacement, and all signals for row 1 were rerouted to row 2 as shown, internal interconnections between row 0 and row 1 in the DSP block would not be replaced, and the DSP block would not perform as required. Thus, FIG. 3A illustrates why conventional row redundancy does not generally work for rows that extend through a multi-row block. FIG. 3A also shows chain signals that pass from one row to the next, providing a connection between rows of the logical block. In the case of a multi-row block these may be multi-bit operands, eg. 18 bits. Although LABs may also have chain signals, these are conventionally single bit carry signals.

Another problem illustrated in FIG. 3A is that functions performed in different rows within the multi-row block may not be the same from one row to another. Typically, because of the nature of DSP blocks, internal elements within the DSP block have fixed functions and are not configurable in the way that LABs are. For example, in FIG. 3A row 1 contains elements with functions A and C, while row 2 contains elements with functions A and B. So row 1 cannot be directly replaced by row 2.

Figure 3B:
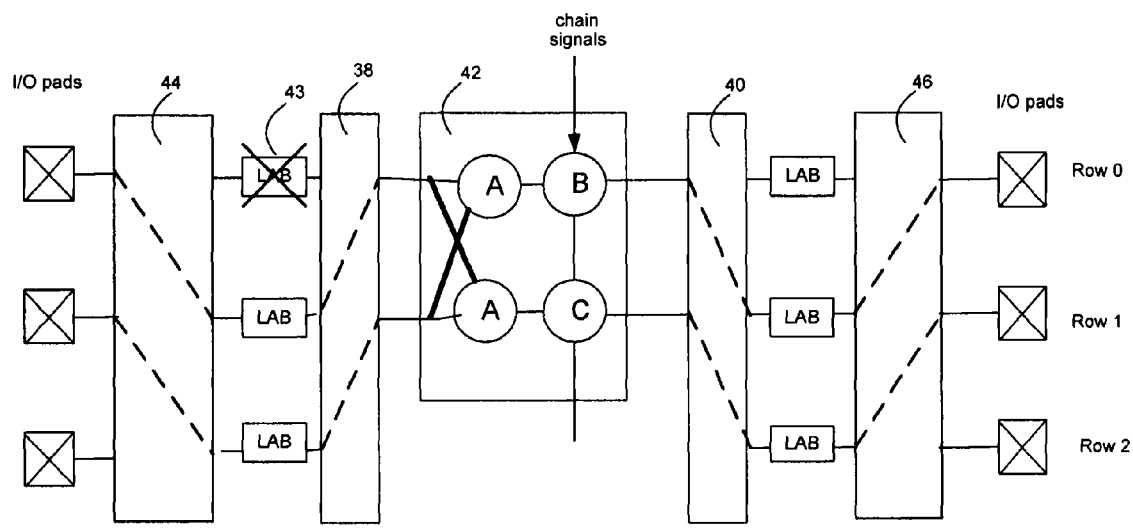
FIG. 3B shows a PLD with a multi-row block where signals are rerouted by additional redundancy circuits on either side of the multi-row block.

One approach to providing redundancy in an array that contains multi-row blocks is shown in FIG. 3B. This shows additional redundancy muxes 38, 40 added between LABs and a multi-row block 41. The additional redundancy muxes 38, 40 reroute communication from one row to a neighboring row. In particular, as shown in FIG. 3B, additional redundancy muxes 38, 40 allow communication to be rerouted to a multi-row block that extends through a defective row. Here, row 0 is defective because of a defective LAB block 43. Therefore, input and output redundancy circuits 44, 46 have redirected input and output communication from row 0 to row 1. Input and output and output redundancy circuits have also redirected input and output communication from row 1 to row 2. Any lower rows may also be rerouted in this manner. Additional redundancy circuits then reroute communication from row 1 back to row 0 for the multi-row block and reroute communication from row 2 back to row 1 for the multi-row block. Thus, even though there is a defect in row 1, not all of row 1 is replaced. The portion of row 1 in the multi-row block is still used. Multi-row block 42 receives the same input signals as it would if no defects were present.

Figure 3C:
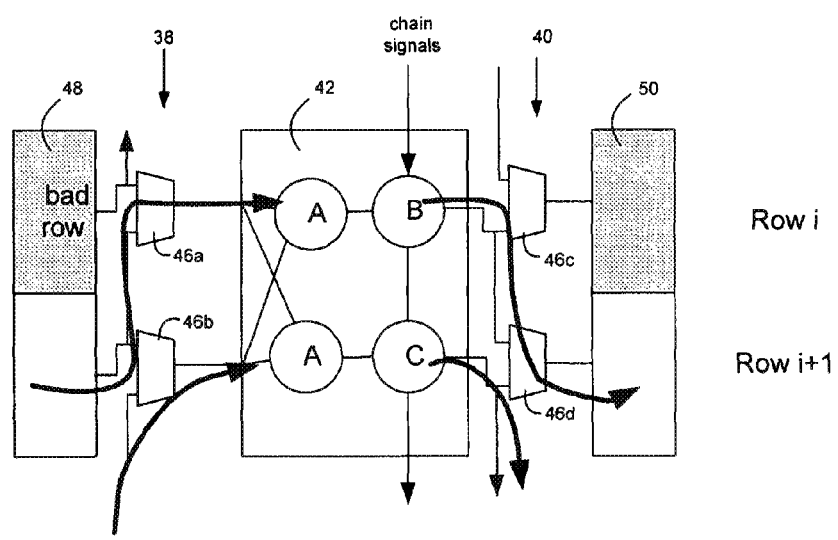
FIG. 3C shows a more detailed view of the additional redundancy circuits of FIG. 3B.

FIG. 3C shows a more detailed view of the rerouting of communication from on either side of multi-row block 42. In particular, FIG. 3C shows additional redundancy circuits 38, 40 including redundancy muxes 46a-d and connections, which allow communication to be rerouted up by a row at a multi-row block 42. Each input and output has a redundancy multiplexer (mux) to select an input or output from the same row or a neighboring row. The arrows show the flow of communication from row i+1 in the routing input region 48 and routing output region 50 (connecting to LAB regions on either side), up to row i in the multi-row block.

While the scheme of FIGS. 3B-C provides redundancy that allows operation of a logic array with a defective LAB, defects may occur within a multi-row block also, and the scheme of FIGS. 3B-C does not provide a mechanism to deal with such defects. Also, this scheme requires additional redundancy circuits, which occupy valuable space and increase cost.

An alternative approach is to provide a multi-row block that has internal redundancy capability that allows replacement of a row slice (the term "row slice" is used here to describe that portion of a row that is within a multi-row block). An example of a multi-row block with such internal redundancy has two notable aspects. Firstly, redundant internal logic connections are provided within the multi-row block to allow replacement of any internal logic connections between rows. Secondly, where differences occur between functions in neighboring rows, configurable elements are provided that can perform their intended function (default condition when no defects are present), and can be reconfigured to perform the function of an element in a neighboring row also.

FIG. 4A shows an example of the internal structure of a multi-row block with two elements shown in each row (three rows of two elements are shown, though actual multi-row blocks may have more than three rows with more than two elements per row). FIG. 4A shows a logical connection 52 between row 0 and row 1. The logical connection sends data from an element in row 0 down to a next element in row 1. Such connections are common in multi-row blocks such as DSP blocks where logic signals propagate not only from one element in a row to the next element in the same row, but also from an element in one row to an element in a neighboring row. In contrast, LABs generally only have logic communication between rows through the routing fabric. It should be noted that the logic connection is a multi-bit data bus capable of rapidly communicating multi-bit numbers.

FIG. 4B shows internal redundant logic connections 54a,b provided to replace the internal logic connection 52 when a defect occurs. In particular, connections 54a,b are provided from row 0 and row 1 to row 2. During normal operation, when no defect is present, these internal redundant logic connections are not active. However, when a defect is present in either row 0 or row 1, these connections may be used to route logic signals to or from a replacement row. Mux 56 provides the ability to select between the redundant logic connections 54a,b so that the redundant connection to the element of row 2 can be from row 0 or row 1.

FIG. 4C shows an example where row 1 is determined to be defective (as indicated by shading). In this case, the defect in row 1 may occur in a LAB or elsewhere, including within the multi-row block. Because row 1 is defective, row 2 is used to replace row 1. In this case the whole of row 2 is used to replace the whole of row 1, including a row slice within the multi row block. Because row 1 is the destination row for the internal logic connection, a redundant logic connection 54a that has row 2 as the destination row is substituted for the internal logic connection. The redundant logic connection 54a extends from row 0, through defective row 1, to row 2, without passing through routing fabric, or otherwise passing outside of the multi-row block. Unused logic connections are shown as dotted lines in this and other figures.

FIG. 4D shows another example where row 0 is determined to be defective. Here, row 1 is used to replace row 0 (and row 2 replaces row 1, etc.). Because row 0 is the source row for the internal logic connection and row 0 is being replaced by row 1, a redundant internal logic connection 54b with row 1 as the source row and row 2 as the destination row is selected by mux 56 in this case. This corresponds to the original internal logic connection 52 shifted down by one row (i.e. both source and destination rows moved down by a row).

FIG. 5A shows another example of an internal logic connection 58 that is similar to that of FIG. 4A, but in this case going up from an element in a lower row (row 1) to an element in a higher row (row 0). In some examples, multi-row blocks may have internal logic connections that go up, down, or both in a single multi-row block. It should be noted that the present examples use "up" and "down" in a conventional manner for clarity, but it will be understood that for many purposes, these designations are arbitrary and can be reversed. For example, a defective row may be replaced by a row above it, with communication to each row above the defective row pushed up by a row, and a redundant row provided above the non-redundant rows. Similarly, the orientation of redundancy could be columns instead of the described row orientation, in which case defective blocks would be replaced by adjacent horizontal neighbours. Also, logic connections between rows are not limited in length to one row. In some cases, such internal logic connections may extend two or more rows.

FIG. 5B shows internal redundant logic connections 60a,b provided to replace internal logic connection 58 when a defect occurs in row 0 or row 1. In particular, the internal redundant logic connections 60a,b allow replacement of row 0 or row 1 even if the defect occurs within the multi-row block.

FIG. 5C shows the operation of the system of FIG. 5B when row 1 is defective. In particular, FIG. 5C shows internal redundant logic connection 60a between row 2 and row 0 replacing the internal logic connection 58 of FIG. 5A. Internal redundant logic connection 60a goes from row 2, through defective row 1, to row 0.

FIG. 5D shows the operation of the system of FIG. 5B when row 0 is defective. In this case, because row 0 is defective, it is replaced by row 1, which in turn is replaced by row 2, and so on. Thus, the internal logic connection 58 from row 1 to row 0 is replaced by a redundant internal logic connection 60b from row 2 to row 1.

Combining the internal redundant logic connections and muxes of FIGS. 4B and 5B gives internal redundant logic circuits that allow substitution of a row slice for a neighboring row slice by rerouting of internal logic connections through a defective row, and rerouting of all internal logic connections below the defective row.

FIG. 6 shows a two-row high portion of a multi-row block that includes internal redundant logic connections 61 corresponding to modifying the multi-row block of FIG. 3B or 3C by adding the redundant internal logic connections of FIGS. 4B and 5B. In particular, redundant internal connections 61 are selected by muxes 62a,b at the inputs of element A of rows i and i+1, so that each row may receive an input from its own routing input region, or from the routing input region of another row according to the mux configuration. For example, row i can receive an input from row i−2, i−1, i+1 or i+2. This is a general example of the redundant connections needed where a row has connections to rows immediately above and below. Where a row has internal logic connections beyond these immediately adjacent rows, additional redundant internal logic connections may be needed. In general, if internal logic connections extend n rows, then redundant internal logic connections will extend n+1 rows so that connections can all be shifted by a row.

In addition to the redundant internal connections, FIG. 6 shows configurable elements 64, 66 in rows i and i+1 respectively. The configurable element 64 in row i is intended to perform function B, but in the case of a defective row must be able to perform the function C of the row above. Similarly, configurable element 66 in row i+1 has an intended function C, but is reconfigurable to perform function B also in the case of a defective row. This allows element 66 to replace the element above it. In general, certain elements in multi-row blocks may be configurable to perform their intended function (default function) and also be configurable to perform the function of an element in the row above if the element above has a different function. Chain signals are provided with muxes that select a chain signal from a row immediately above, or a row that is one row removed, so that if the row immediately above is defective, the next row up is selected.

It should be noted that the example of FIG. 6 does not include additional redundancy circuits on either side of the multi-row block because full-row redundancy can be achieved using the scheme shown, even where the row extends through a multi-row block. Thus, instead of rerouting connections at either side of a multi-row block as shown in FIG. 3B, here an entire row (including a row slice within a multi-row block) is replaced so that such rerouting is unnecessary. Thus, any increased area needed for redundant internal routing and configurable elements is offset by a saving in additional redundancy circuits on either side of the multi-row block.

Figure 7A:
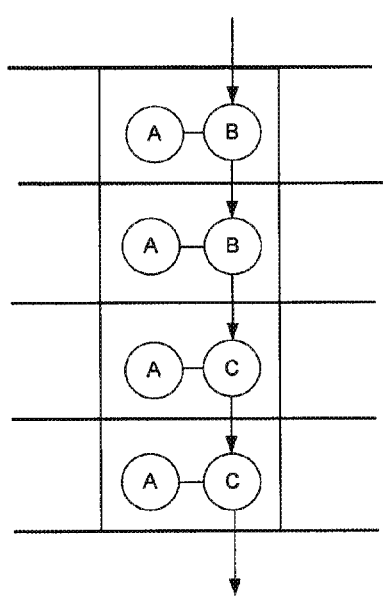
FIG. 7A shows elements in a four row high multi-row block having different functions in different rows.

FIG. 7A shows a four row high portion of a multi-row block. In particular, FIG. 7A illustrates the different intended functions of elements in different rows. The top two rows have elements with functions A and B, whereas the bottom two rows have elements with intended functions A and C. It is typical in a multi-row block to use elements that perform only their intended function and are not reconfigurable to perform other functions. In contrast, examples described here show reconfigurable elements within multi-row blocks.

Figure 7B:
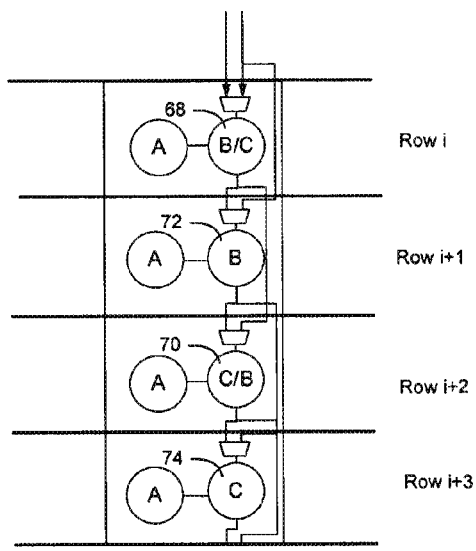
FIG. 7B shows elements in a four-row high multi-row block having configurable elements so that each row has elements capable of performing a default function and the function of an element in the row above.

FIG. 7B shows how the multi-row block of FIG. 7A has reconfigurable elements at locations where the corresponding element in a row above has a different function. In particular, each element is capable of performing its own intended function and is also capable of performing the function of the corresponding element in the row above. It should be noted that the pattern of FIG. 7B does not repeat every row. Individual rows may have different elements. Where configurable elements are not needed (e.g. where elements have the same intended function as corresponding elements in a row above) elements with a fixed function are used. Thus, for example, configurable elements 68 and 70 with functions B or C are shown in rows i and i+2, while fixed function elements 72 and 74 (with functions B and C respectively) are shown in rows i+1, and i+3. As can be seen in FIG. 7B, all rows are not identical and some rows contain no configurable elements. FIG. 7B also shows muxes provided to chain signals so that a chain signal from a row immediately above, or from a higher row can be selected. Chain signals are also multi-bit signals that are used for row-to-row communication.

Figure 8:
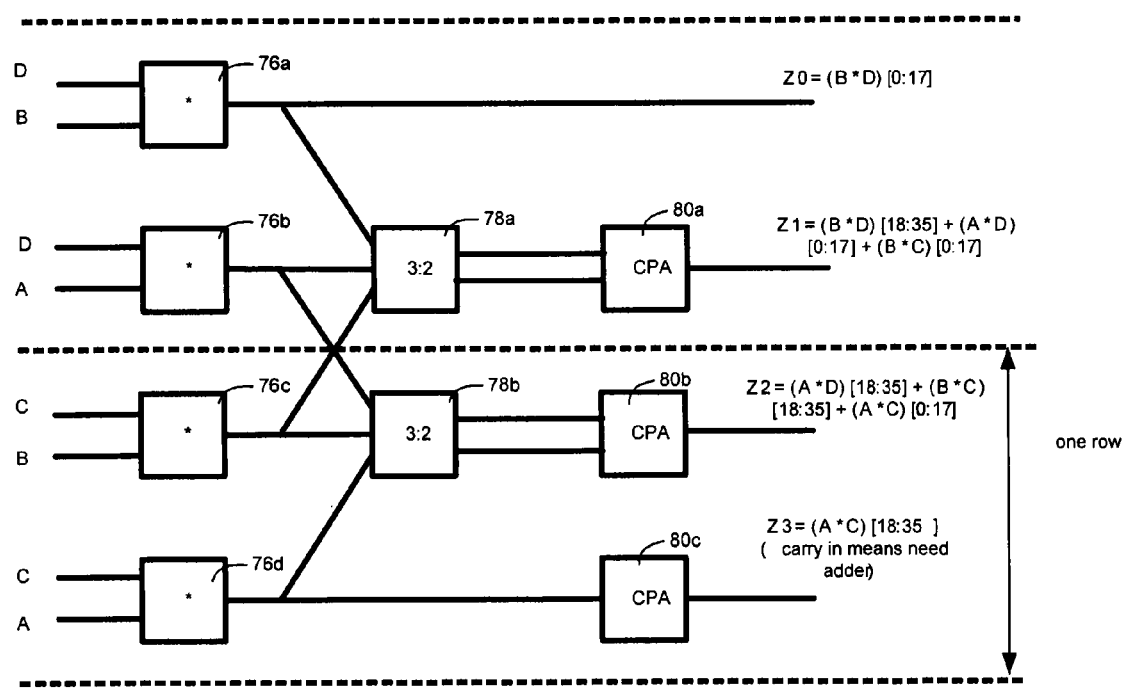
FIG. 8 shows a particular example of a multi-row block that performs 36*36 multiplication, using two different row slices.

FIG. 8 shows a particular example of a two row high multi-row block. In particular, FIG. 8 shows a 36*36 multiplier implemented over two rows in a multi-row DSP block. This multiplier is capable of multiplying two 36-bit numbers together to produce a 72-bit result. This is an example of a function that may be too complex to be achieved over a single row and therefore (in some designs) may require that the multiplication be spread out over two rows. Other functions, particularly more complex functions, may also require two or more rows in a multi-row block.

FIG. 8 shows multiplication of two 36-bit operands that are each split into two parts that are individually 18-bit numbers. Here, the first operand is A+B, and the second operand is C+D, where the first part of each operand represents the most significant 18 bits and the second part represents the least significant 18 bits. The result to be calculated is (A+B)*(C+D)=A*C+A*D+B*C+B*D, where each of the terms on the right, being a product of two 18-bit numbers, is a 36-bit number. First, a pair of 18*18 multipliers 76a-d in each row slice calculates the products of parts of operands. Thus, in the upper row slice, the products D*B and D*A are calculated. The product D*B, being the product of the two least significant parts, provides a 36-bit number of which the least significant 18 bits are the 18 least significant bits of the desired result. Typically this result would be provided in carry-save format, comprising two 36 bit numbers for the sum and carry respectively. For brevity this will be ignored in this description. These 18 bits, (B*D)[0:17], are provided as a first output Z0. The most significant bits of this product, (B*D)[18:35], are provided as an output to an adder in the upper row slice. The conventional manner of adding three numbers is to perform a first addition using a 3:2 compressor followed by a CPA 80a to reduce the two outputs into a single sum. In parallel with the calculation of B*D, 18*18 multiplier 76b calculates A*D. The least significant 18 bits, (A*D)[0:17], are sent to adder 78a in the upper row slice, while the most significant bits, (A*D)[18:35], are sent to an adder 78b in the lower row slice. This is an example of an internal logic connection between elements of adjacent rows in a multi-row block. The internal logic connection provided here is 18-bits wide to support rapid communication of the 18-bit result A*D[18:35] to a subsequent element in the lower row. In the lower row slice, an upper multiplier 76c multiplies B and C, providing the least significant bits (B*C)[0:17] to adder 78a in the upper row slice (again, using an 18-bit data bus). This is another example of an internal logic connection between elements of adjacent rows in a multi-row block. The most significant bits, (B*C)[18:35], are sent to adder 78b of the lower row. The lower multiplier 76d multiplies A and C, providing the least significant 18 bits, (A*C)[0:17] to adder 78b of the lower row slice, and providing the most significant bits (A*C)[18:35] to a Carry Propagate Adder (CPA) 80c. CPA 80c is required only to propagate any possible carry from the Z2 adder. This result is provided as an output Z3, representing the 18 most significant bits of the result.

As can be seen in FIG. 8, adder 78a of the upper row adds together three 18-bit numbers to obtain the next least significant bits of the result. The result is provided as two outputs of the adder. Adder 78a is considered a 3:2 adder because it adds together three inputs to provide the sum as two outputs. CPA 80a receives the two outputs of the adder and provides the result as output Z1. As described earlier the conventional method of adding three numbers is the use of a 3:2 followed by CPA. The adder 78b of the lower row also receives three inputs, adds them together, and provides the sum as two outputs to a CPA 80b.

CPA 80b provides this output Z1 as the next least significant bits of the result. Thus, the four outputs, Z0, Z1, Z2, and Z3 are 18-bit numbers that are successively more significant 18-bit portions of the 72-bit result.

One way to implement the multiplier of FIG. 8 is to provide only the components corresponding to the functional blocks shown. Thus, in the upper row two multipliers, an adder, and a CPA are provided, with one internal logic output provided to the row below, and one internal logic input received from the row below. In the lower row, two multipliers, an adder, and two CPAs are provided with one internal logic output provided to the row above and one internal logic input received from the row above. However, in this case, each row slice has different hardware and is not configurable to replace a neighboring row slice.

Figure 9:
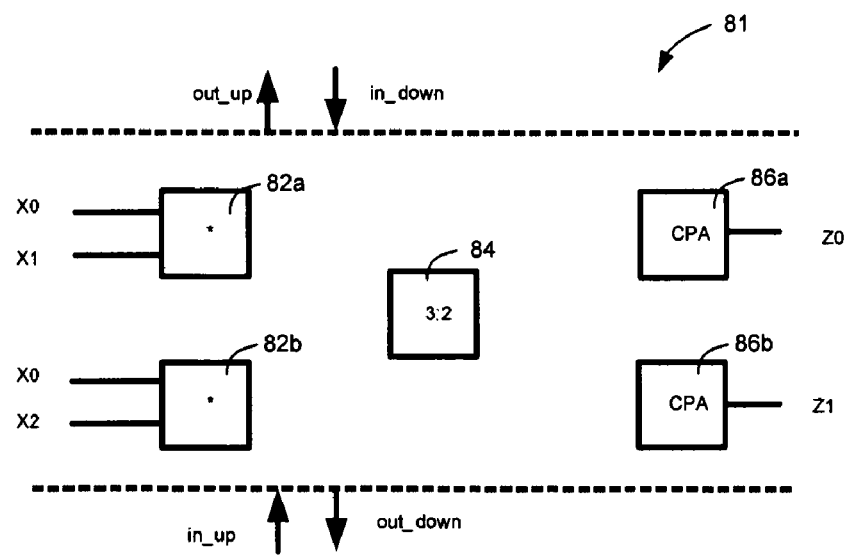
FIG. 9 shows an example of a configurable row slice that is configurable to perform as either one of the row slices of FIG. 8.

FIG. 9 shows the set of arithmetic elements that are required to form a configurable row slice 81 that can be configured to perform as either the upper row slice or lower row slice of FIG. 8. In particular, the row slice contains two multipliers 82a, 82b, a 3:2 adder 84 and two CPAs 86a,b, which provide outputs Z0 and Z1. By comparing to FIG. 8 it can be seen that this contains enough resources to implement either the top or bottom row of FIG. 8. The row slice also has internal logic connections to both the row above (out_up, and in_down) and the row below (in_up, and out_down). The configurable row slice has two different modes, Top (or upper) and Bottom (or lower), according to whether it is operating as the upper row slice or lower row slice of FIG. 8. The outputs and internal logic connections are configured in each of these modes according to the following table:

|  | Top | Bottom |
|---|---|---|
| Z0 | (X0 * X1) [0:17] | in_down + (X0 * X1) [18:35] + (X0 * X2) [0:17] |
| Z1 | (X0 * X1) [18:35] + (X0 * X2) [0:17] + in_up | (X0 * X2) [18:35] |
| out_up | nil | (X0 * X1) [18:35] |
| out_down | (X0 * X2) [18:35] | nil |

Thus, in Top mode, output Z0 is the 18 least significant bits of X0*X1 (the inputs to the top multiplier), and output Z1 is the sum of the 18 most significant bits of X0*X1, plus the least significant bits of X0*X2 (the inputs to the bottom multiplier), plus in_up, the input from the row below. In Top mode, no output is provided to the row above, so out_up is unused. The 18 most significant bits of X0*X2 are provided as out_down, the output to the row below.

In Bottom mode, output Z0 is the sum of the input in_down received from the row above, plus the 18 most significant bits of X0*X1, plus the 18 least significant bits of X0*X2. Output Z1 is simply the 18 most significant bits of X0*X2. Output out_up is the 18 most significant bits of X0*X1, while output out_down is not needed in this mode.

FIG. 9 gives a simplified view of the elements of the configurable row slice 81 and the desired inputs and outputs, without the connections between elements. The configurable connections may be provided in different ways and the present invention is not limited to any particular implementation.

Figure 10:
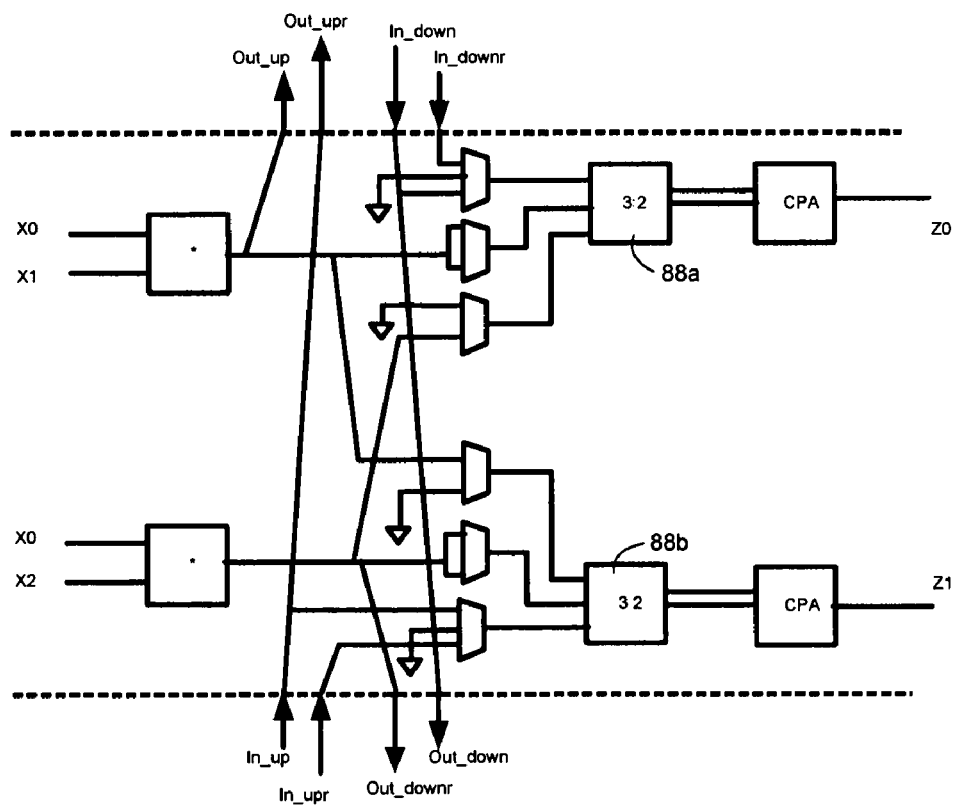
FIG. 10 shows an implementation of the configurable row slice of FIG. 9 using two adders.

FIG. 10 shows a first example of hardware to implement the configurable row slice 81 of FIG. 9. In particular, FIG. 10 shows two 3:2 88a,b adders that receive their inputs from multiplexers that are configured to select the appropriate inputs depending on the mode in which the row slice is operated. Compared to FIG. 9, FIG. 10 contains more arithmetic resources to simplify the multiplexer structure required to create the various modes. In general for any block there may be tradeoffs available in the amount of logic and complexity of multiplexing to connect the resources. FIG. 9 represents a lower bound for the block of FIG. 8, while FIG. 10 uses more resources than the minimum. For example, in Top mode, the upper adder 88a receives input from the middle multiplexer, which selects the 18 least significant bits (two inputs are shown for this multiplexer corresponding to the most significant and least significant bits of X0*X1). The other inputs to adder 88a are not used in this mode. The lower adder 88b receives the most significant bits of X0*X1 from the upper multiplier, the least significant bits of X0*X2 from the lower multiplier and up_in (input from the row below) through its input multiplexers, and adds these together, with the product provided as output Z1. Out_down is the most significant bits of X0*X2 from the lower multiplier. Logical connections between rows of FIG. 10 (e.g. In_up, In_upr, Out_down, etc) are 18-bit data busses in this example. In other multi-row blocks such internal logical connections in a multi-row block may be formed using different multi-bit busses.

Each input and output between neighboring rows includes two connections in this example, a connection between a given row and its immediate neighbor (one row away), and a redundant connection between the given row and a row that is two rows away. If a top row is defective, both top and bottom rows shift down by one row and continue to use the same signals. If the bottom row is defective, then it shifts down by one and the top row stays in the same place and uses the in_upr signal, while the bottom row uses the in_downr signal. It should be noted that the multiplexer select signals (not shown here) are driven by a combination of the mode and redundancy signals.

Figure 11:
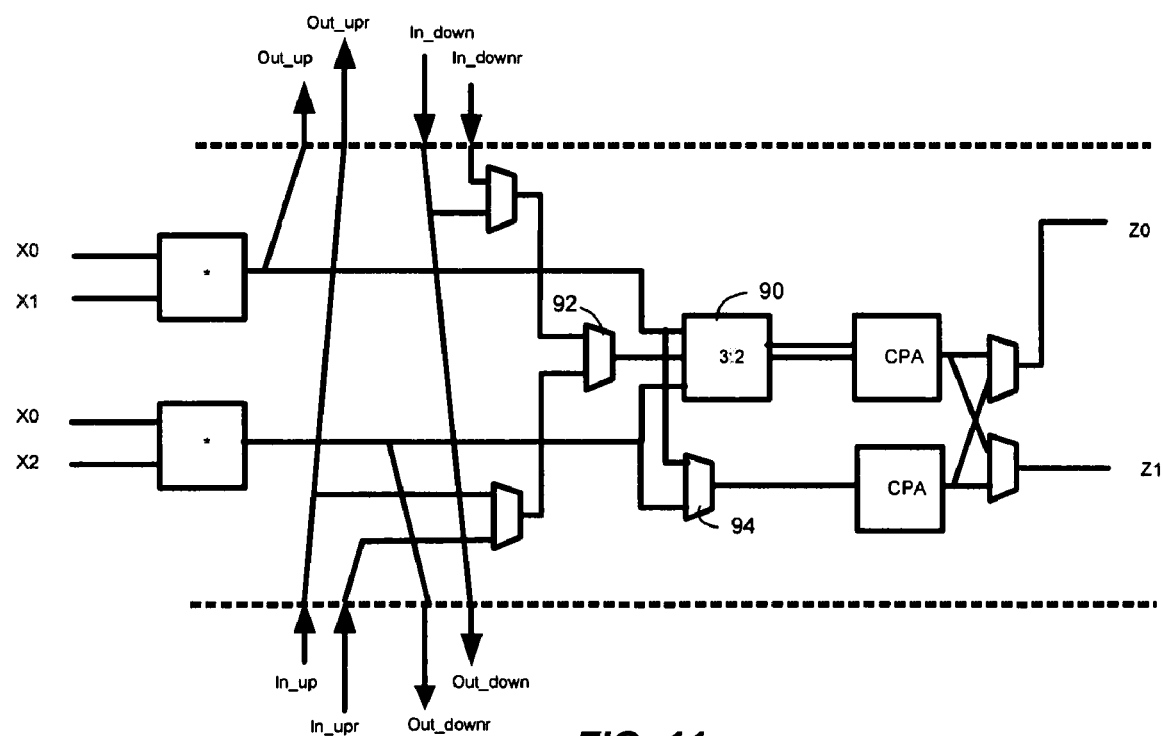
FIG. 11 shows another implementation of the configurable row slice of FIG. 9 using only one adder.

In another example implementation, multiplexing can be rearranged to use less addition hardware at the cost of more multiplexing as shown in FIG. 11. The choice of implementation may depend on various factors including whether multiplexers or other components can be used in additional modes (not shown) and a cost/benefit analysis of area versus circuit delay. For example, in FIG. 10 it can be seen that top and bottom modes contain a common subexpression of the form {in_up/in_down}+X0*X1[18:35]+X0*X2[0:17], while the other output is an unmodified product of two operand parts. Therefore, the multiplexing can be rearranged to use less addition hardware at the cost of more multiplexing as shown in FIG. 11. Note that in this example both FIG. 10 and FIG. 11 contain 6 multiplexers, but there are more levels of multiplexing in FIG. 11 (3 vs 1.)

FIG. 11 shows a single adder 90 with inputs from each multiplier and multiplexer 92 providing the adder with an additional input from either in_down or in_up (or their redundant counterparts in_downr, in_upr). Thus, the adder can provide an output corresponding to the first subexpression: {in_up/in_down}+X0*X1[18:35]+X0*X2[0:17]. Another multiplexer 94 provides an output that is selected from the outputs of the two multipliers, X0*X1 or X0*X2. The output of the adder and the output of the multiplexer can then be routed as appropriate to outputs Z0 and Z1 depending on the mode in which the row slice is operating. As in FIG. 10 inter-row logical inputs and outputs occur in pairs, with connections between adjacent rows and connections that pass through a row.

The above examples refer to a physical row in a PLD, which is a convenient unit for redundancy purposes. However, aspects of the present invention are not limited to physical rows. In some examples a unit chosen for redundancy purposes is different from a physical row. A set of logic which is replicated in some direction may be considered a virtual row, even if it does not have a straight boundary in the physical PLD, or even if it does not use a contiguous strip within the PLD.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. A programmable logic device comprising:
a plurality of rows of elements interconnected by configurable connections;
a plurality of row-redundancy circuits that replace defective rows with non-defective rows;
a multi-row block of elements that includes elements in each of a first row, a second row, and a third row, an internal logic connection between a first element of the first row and a second element of the second row; and
internal redundant connections in the multi-row block, the internal redundant connections including an internal redundant logic connection between the first element and a third element in a third row to replace the internal logic connection between the first element and the second element when the second element is defective.

2. The programmable logic device of claim 1 wherein the first row is immediately above the second row, the second row is immediately above the third row, and the internal logic connection between the first element and the third element extends through the second row in the multi-row block.

3. The programmable logic device of claim 2 wherein the internal redundant connections further include an internal redundant connection between the second element and the third element to replace the internal logic connection between the first element and the second element when the first row is defective.

4. The programmable logic device of claim 1 wherein functions performed by the first, second, and third rows are not identical in a default condition where no defect is present, and configurable elements allow each row to perform its default functions and default functions of an adjacent row.

5. The programmable logic device of claim 1 wherein the multi-row block is a Digital Signal Processing block.

6. The programmable logic device of claim 5 wherein the multi-row block performs multiplication of two numbers.

7. The programmable logic device of claim 6 wherein the multi-row block includes multiplier elements and at least one adder element in each row of the multi-row block.

8. The programmable logic device of claim 7 wherein an adder element in a particular row of the multi-row block receives inputs from multiplier elements in the particular row and receives an input from a multiplier element in another row.

9. A method of operating a multi-row programmable logic device containing a multi-row block, comprising:
determining that a row of the programmable logic device is defective;
rerouting input signals to and output signals from the defective row to an adjacent row;
in the multi-row block that extends across the defective row and the adjacent row, replacing internal logic connections between the defective row and neighboring rows with internal logic connections between the adjacent row and the neighboring rows; and
reconfiguring the elements of the adjacent row to perform functions of the defective row.

10. The method of claim 9 wherein the adjacent row is below the defective row and the rerouting includes rerouting an internal logic connection of the multi-row block from a row above the defective row through the defective row to the adjacent row.

11. The method of claim 9 further comprising rerouting input signals to, and output signals from all rows below the defective row and rerouting all internal logic connections of the multi-row block between rows below the defective row.

12. The method of claim 9 further comprising rerouting input signals to, and output signals from all rows below the defective row and reconfiguring elements in some, but not all of the rows below the defective row.

13. The method of claim 9 wherein the multi-row block is a Digital Signal Processing block.

14. The method of claim 13 wherein the multi-row block performs multiplication of two numbers that are received as inputs to two rows of the multi-row block.

15. A programmable logic device comprising:
a plurality of rows of elements;
a plurality of row-redundancy circuits to replace a defective row with a non-defective row;
a multi-row digital signal processing block that extends through the plurality of rows, the multi-row digital signal processing block performing different functions, using physically different elements, in different rows in the multi-row block; and
a plurality of internal logic connections between rows within the multi-row block, the multi-row block having a plurality of redundant internal logic connections to replace the plurality of internal logic connections when a row of the plurality of rows is replaced by the row-redundancy circuits.

16. The programmable logic device of claim 15 wherein the multi-row block performs multiplication and each row in the multi-row block contains at least a multiplier element and an adder element, each adder element receiving input from a multiplier element in the same row and a multiplier element in a different row.

17. The programmable logic device of claim 15 wherein the multi-row block receives numbers to be multiplied through inputs in two or more rows and provides a result through outputs in two or more rows.

18. The programmable logic device of claim 15 wherein the physically different element include non-configurable elements that perform a single function and configurable elements that perform a first function in a default mode and perform a redundant function in a redundant mode.

19. The programmable logic device of claim 18 wherein the redundant function of an element is the default function of a corresponding element in an adjacent row.

* * * * *